(12) United States Patent
Endo et al.

(10) Patent No.: US 9,395,628 B2
(45) Date of Patent: Jul. 19, 2016

(54) RESIST UNDERLAYER FILM-FORMING COMPOSITION CONTAINING ARYL SULFONATE SALT HAVING HYDROXYL GROUP

(71) Applicant: NISSAN CHEMICAL INDUSTRIES, LTD., Tokyo (JP)

(72) Inventors: Takafumi Endo, Toyama (JP); Keisuke Hashimoto, Toyama (JP); Hirokazu Nishimaki, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/767,404

(22) PCT Filed: Feb. 21, 2014

(86) PCT No.: PCT/JP2014/054168
§ 371 (c)(1),
(2) Date: Aug. 12, 2015

(87) PCT Pub. No.: WO2014/129582
PCT Pub. Date: Aug. 28, 2014

(65) Prior Publication Data
US 2015/0378260 A1    Dec. 31, 2015

(30) Foreign Application Priority Data
Feb. 25, 2013 (JP) ................. 2013-034217

(51) Int. Cl.
| | |
|---|---|
| *H01L 21/311* | (2006.01) |
| *G03F 7/11* | (2006.01) |
| *G03F 7/09* | (2006.01) |
| *H01L 21/027* | (2006.01) |
| *H01L 21/308* | (2006.01) |

(52) U.S. Cl.
CPC ...... *G03F 7/11* (2013.01); *G03F 7/091* (2013.01); *G03F 7/094* (2013.01); *H01L 21/0274* (2013.01); *H01L 21/0277* (2013.01); *H01L 21/3081* (2013.01); *H01L 21/3086* (2013.01); *H01L 21/31133* (2013.01)

(58) Field of Classification Search
CPC ............. H01L 21/31133; G02B 5/305
USPC ............................ 430/311; 438/703
See application file for complete search history.

(56) References Cited

U.S. PATENT DOCUMENTS

| | | | |
|---|---|---|---|
| 2013/0202999 A1* | 8/2013 | Iwato | G03F 7/004 430/270.1 |
| 2014/0107266 A1* | 4/2014 | Uchiyama | C08L 69/00 524/127 |

FOREIGN PATENT DOCUMENTS

| | | |
|---|---|---|
| JP | 2009-503594 A | 1/2009 |
| JP | 2009-047754 A | 3/2009 |
| JP | 2009175436 A | 8/2009 |
| JP | 2009-265262 A | 11/2009 |
| JP | 2010-237491 A | 10/2010 |
| JP | 2011-510355 A | 3/2011 |
| JP | 2011-186139 A | 9/2011 |
| KR | 10-0959190 B1 | 5/2010 |
| WO | 2012/176767 A1 | 12/2012 |
| WO | 2013/090529 A1 | 6/2013 |

OTHER PUBLICATIONS

May 20, 2014 Written Opinion in International Patent Application PCT/JP2014/054168.
May 20, 2014 International Search Report in International Patent Application PCT/JP2014/054168.

* cited by examiner

*Primary Examiner* — Dung Le
(74) *Attorney, Agent, or Firm* — Oliff PLC

(57) ABSTRACT

There is provided a resist underlayer film-forming composition to reduce the amount of sublimate generated from the resist underlayer film at baking process and to suppress aging and have high storage stability. A resist underlayer film-forming composition including an aryl sulfonic acid salt compound having a hydroxy group of Formula (1):

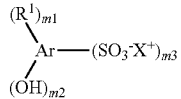

Formula (1)

(where Ar is a benzene ring or an aromatic hydrocarbon ring wherein benzene rings are condensed; m1 is an integer of 0 to (2+2n), m2 and m3 each is an integer of 1 to (3+2n), and (m1+m2+m3) is an integer of 2 to (4+2n), with the proviso that n is the number of the benzene rings or condensed benzene rings in the aromatic hydrocarbon ring and is an integer of 1 to 6; $X^+$ is $NH_4^+$, a primary ammonium ion, secondary ammonium ion, tertiary ammonium ion, quaternary ammonium ion, sulfonium ion, or an iodonium cation).

11 Claims, No Drawings

RESIST UNDERLAYER FILM-FORMING COMPOSITION CONTAINING ARYL SULFONATE SALT HAVING HYDROXYL GROUP

TECHNICAL FIELD

The present invention relates to a crosslinking catalyst for a resist underlayer film-forming composition for lithography that is effective at the time of semiconductor substrate processing and a resist underlayer film-forming composition containing the crosslinking catalyst, and a method for forming a resist pattern using the resist underlayer film-forming composition and a method for producing a semiconductor device.

BACKGROUND ART

Conventionally, microfabrication has been carried out by lithography using a photoresist composition in the production of semiconductor devices. The microfabrication is a method for processing inducing the steps of forming a thin film of a photoresist composition on a substrate to be processed such as a silicon wafer, irradiating the thin film with active light such as ultraviolet rays through a mask pattern in which a pattern of a semiconductor device is depicted, developing the pattern, and etching the substrate to be processed such as a silicon wafer by using the obtained photoresist pattern as a protection film. In recent years, however, semiconductor devices have been further integrated, and the active light to be used has had a shorter wavelength from a KrF excimer laser (248 nm) to an ArF excimer laser (193 nm). This raises serious problems of the effects of diffused reflection from the substrate and standing wave of active light. Consequently, a method for providing a resist underlayer film called bottom anti-reflective coating (BARC) between a photoresist and a substrate to be processed has been widely applied. In order to achieve further microfabrication, a lithography technique using extreme ultraviolet rays (EUV, wavelength 13.5 nm) and electron beams (EB) as the active light has been developed. In the EUV lithography or the EB lithography, a specific anti-reflective coating is not required because the diffused reflection from the substrate and the standing wave are not usually generated. The resist underlayer film, however, has begun to be widely studied as an auxiliary film for improving the resolution of a resist pattern and adhesion.

The resist underlayer film formed between the photoresist and the substrate to be processed described above is generally formed as a thermally curable crosslinking film that does not generate mixing with the resist by carrying out a baking process after the application of a resist underlayer film-forming composition onto the substrate to be processed in order to reduce mixing with the resist stacked as an upper layer. Usually, a crosslinkable compound (a crosslinking agent) and a catalyst (a crosslinking catalyst) for promoting the crosslinking reaction are added to the resist underlayer film-forming composition in addition to the polymer resin as a main component in order to form such a thermally curable film. Particularly, a thermal acid generator such as a sulfonic acid compound, a carboxylic acid compound, and a sulfonic acid ester are mainly used as the crosslinking catalyst.

In recent years, generation of sublimation component (sublimate) derived from the polymer resin and low molecular weight compounds such as the crosslinking agent and the crosslinking catalyst at the time of baking when the resist underlayer film is formed by using the resist underlayer film-forming composition in the lithography process of semiconductor device production has been a new problem. Such a sublimate contaminates the inside of film formation apparatus by attaching and accumulating in the film formation apparatus during the semiconductor device production process. These contaminations may be a defect generation factor by attaching on a wafer as foreign substance. Consequently, a new underlayer film-forming composition is required to be developed such that the sublimate generated from the resist underlayer film is reduced as much as possible. And resist underlayer films showing low sublimate generation property have been studied (refer to, for example, Patent Document 1 and Patent Document 2).

PRIOR ART DOCUMENTS

Patent Documents

Patent Document 1: JP 2009-175436 A
Patent Document 2: JP 2010-237491 A

SUMMARY OF THE INVENTION

Problem to be Solved by the Invention

Such a sublimate generation is caused also because the aryl sulfonic acid salts (for example, pyridinium p-toluenesulfonate) as the thermal acid generators that are widely used as the crosslinking catalyst for the resist underlayer film-forming composition indicate neutrality or weak acidity in the resist underlayer film-forming composition and thus thermal decomposition is required to generate strong acid required for the crosslinking reaction. That is, a low generation efficiency of the acid as the catalyst of the crosslinking reaction from such aryl sulfonic acid salts at the film formation temperature (a baking temperature) of the resist underlayer film results in insufficient crosslinking reaction and easy generation of sublimation from the low molecular weight compound. On the other hand, aryl sulfonic acids (for example, p-toluenesulfonic acid) widely used as a crosslinking catalyst similarly to the aryl sulfonic acid salts indicate strong acidity in the resist underlayer film-forming composition and thus can effectively act as the crosslinking catalyst. Such aryl sulfonic acids, however, are strong acids and easily cause interaction with the polymer resin and the crosslinking agent in the resist underlayer film-forming composition. Consequently, the aryl sulfonic acids may cause quality deterioration (aging) of a resist underlayer film-forming composition.

The present invention is aimed to solve the problem described above and an object of the present invention is to provide a crosslinking catalyst for a resist underlayer film-forming composition that effectively achieves reduction of sublimates generated at the time of conventional film formation of a resist underlayer film and suppresses aging of the resist underlayer film-forming composition and a resist underlayer film-forming composition containing the crosslinking catalyst, and a method for forming a resist pattern using the resist underlayer film-forming composition and a method for producing a semiconductor device.

Means for Solving the Problem

The present invention provides, as a first aspect, a resist underlayer film-forming composition comprising an aryl sulfonic acid salt compound having a hydroxy group of Formula (1):

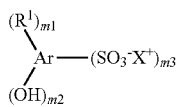

Formula (1)

(where Ar is a benzene ring or an aromatic hydrocarbon ring in which benzene rings are condensed; $R^1$ each is a substituent of a hydrogen atom in the aromatic ring and is a nitro group, an amino group, a carboxy group, a halogen atom, a $C_{1-10}$ alkoxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group combining thereof; m1 is an integer of 0 to (2+2n), m2 and m3 each is an integer of 1 to (3+2n), and (m1+m2+m3) is an integer of 2 to (4+2n), with the proviso that n is the number of the benzene rings or the number of the condensed benzene rings in the aromatic hydrocarbon ring and is an integer of 1 to 6; $X^+$ is $NH_4^+$, a primary ammonium ion, a secondary ammonium ion, a tertiary ammonium ion, a quaternary ammonium ion, a sulfonium ion, or an iodonium cation), as a second aspect, the resist underlayer film-forming composition as described in the first aspect in which Ar is a benzene ring, as a third aspect, the resist underlayer film-forming composition as described in the first aspect in which X+ is an ammonium ion, as a fourth aspect, the resist underlayer film-forming composition as described in any one of the first aspect to the third aspect in which $R^1$ is a methyl group or a carboxy group, as a fifth aspect, the resist underlayer film-forming composition as described in any one of the first aspect to the fourth aspect in which m1 is 0 and m2 and m3 each is 1, as a sixth aspect, the resist underlayer film-forming composition as described in any one of the first aspect to the fifth aspect further comprising a crosslinking agent, as a seventh aspect, a resist underlayer film obtained by applying the resist underlayer film-forming composition as described in any one of the first aspect to the sixth aspect onto a semiconductor substrate and baking the applied resist underlayer film-forming composition, as an eighth aspect, a method for forming a resist pattern used for semiconductor production, the method comprising a step of forming a resist underlayer film by applying the resist underlayer film-forming composition as described in any one of the first aspect to the sixth aspect onto a semiconductor substrate and baking the applied resist underlayer film-forming composition, as a ninth aspect, a method for producing a semiconductor device, the method comprising steps of: forming a resist underlayer film by using the resist underlayer film-forming composition as described in any one of the first aspect to the sixth aspect onto a semiconductor substrate; forming a resist film on the resist underlayer film; forming a resist pattern by irradiation with light or an electron beam and development; etching the resist underlayer film by using the formed resist pattern; and processing the semiconductor substrate by using the patterned resist underlayer film, as a tenth aspect, a method for producing a semiconductor device, the method comprising steps of: forming a resist underlayer film by using the resist underlayer film-forming composition as described in any one of the first aspect to the sixth aspect onto a semiconductor substrate; forming a hard mask on the resist underlayer film; forming a resist film on the hard mask; forming a resist pattern by irradiation with light or an electron beam and development; etching the hard mask by using the formed resist pattern; etching the resist underlayer film by using the patterned hard mask; and processing the semiconductor substrate by using the patterned resist underlayer film, and as an eleventh aspect, the a method for production as described in the tenth aspect, in which the hard mask is formed by application of an inorganic substance or vapor deposition of an inorganic substance.

Effects of the Invention

The crosslinking catalyst for the resist underlayer film-forming composition of the present invention is characterized in that a part of the hydrogen atoms in the aromatic ring of the aryl sulfonic acid salts is substituted with a hydroxy group. The resist underlayer film-forming composition containing the aryl sulfonic acid salts contains the crosslinking catalyst, a polymer resin, and a solvent and optionally contains a crosslinking agent. The crosslinking catalyst of the present invention has a hydroxy group and whereby the acidity of the generated aryl sulfonic acid increases and the crosslinking reaction during the baking process is promoted. In addition, the hydroxy group acts as a crosslink site and thus the sublimate derived from low molecular weight components in the resist underlayer film during the film formation can be effectively reduced. Consequently, generation of the sublimate can be reduced during the formation of the resist underlayer film in which the resist underlayer film-forming composition is applied onto the substrate to be processed and the applied resist underlayer film-forming composition is baked. In addition, defect generation due to reattachment of the sublimate to the formed resist underlayer film can be reduced.

The crosslinking catalyst for the resist underlayer film-forming composition of the present invention forms an ammonium salt, a sulfonium salt, and an iodonium salt and is a thermal acid generator generating sulfonic acid by thermal decomposition only during the baking process. Therefore, the crosslinking catalyst indicates neutrality or weak acidity in the resist underlayer film-forming composition, and thus the crosslinking catalyst is difficult to interact with the polymer resin and the crosslinking agent and quality deterioration caused by aging can be reduced.

MODES FOR CARRYING OUT THE INVENTION

The present invention provides a resist underlayer film-forming composition comprising the aryl sulfonic acid salt compound of Formula (1) having a hydroxy group.

The aryl sulfonic acid salt compound of Formula (1) having a hydroxy group can be used as a crosslinking catalyst.

In the present invention, the resist underlayer film-forming composition contains a polymer, the aryl sulfonic acid salt compound of Formula (1) having a hydroxy group, and a solvent. The resist underlayer film-forming composition can also contain a crosslinking agent and optionally contains additives such as an acid generator and a surfactant. The solid content of the composition is 0.1% by mass to 70% by mass or 0.1% by mass to 60% by mass. The solid content is a content ratio of the whole components of the resist underlayer film-forming composition from which the solvent is removed. In the solid content, the polymer can be contained in a ratio of 1% by mass to 99.9% by mass, or 50% by mass to 99.9% by mass, or 50% by mass to 95% by mass, or 50% by mass to 90% by mass.

The polymer used in the present invention has a weight average molecular weight of 600 to 1000000 or 600 to 200000.

In the aryl sulfonic acid salt compound of Formula (1) having a hydroxy group, Ar is a benzene ring or an aromatic hydrocarbon ring formed by condensing benzene rings; and $R^1$ each is a substituent of a hydrogen atom in the aromatic ring and is a nitro group, an amino group, a carboxy group, a halogen atom, a $C_{1-10}$ alkoxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group combining thereof. m1 is an integer of 0 to (2+2n), m2 and m3 each is an integer of 1 to (3+2n); and (m1+m2+m3) is an integer of 2 to (4+2n), with the proviso that n is the number of the benzene rings or the number of the condensed benzene rings in the aromatic hydrocarbon ring and is an integer of 1 to 6. $X^+$ is $NH_4^+$, a primary ammonium ion, a secondary ammonium ion, a tertiary ammonium ion, a quaternary ammonium ion, a sulfonium ion, or an iodonium cation.

Examples of the $C_{1-10}$ alkoxy group may include a methoxy group, an ethoxy group, a n-propoxy group, an i-propoxy group, a n-butoxy group, an i-butoxy group, a s-butoxy group, a t-butoxy group, a n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group.

Examples of the $C_{1-10}$ alkyl group may include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl-group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{2-10}$ alkenyl group may include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the $C_{6-40}$ aryl group may include a phenyl group, an o-methylphenyl group, a m-methylphenyl group, a p-methylphenyl group, an o-chlorophenyl group, a m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

The organic group containing an ether bond can be $R^{11}$—O—$R^{11}$ ($R^{11}$ each is independently a $C_{1-6}$ alkyl group such as a methyl group and an ethyl group, an alkylene group, a phenyl group, and a phenylene group). Examples of the organic group containing an ether bond may include an organic group containing an ether bond including a methoxy group, an ethoxy group, and a phenoxy group.

The organic group containing a ketone bond is $R^{21}$—C(=O)—$R^{21}$ ($R^{21}$ each is independently a $C_{1-6}$ alkyl group such as a methyl group and an ethyl group, an alkylene group, a phenyl group, and a phenylene group). Examples of the organic group including a ketone bond may include an organic group including a ketone bond including an acetoxy group and a benzoyl group.

The organic group containing a ester bond is $R^{31}$—C(=O)O—$R^{31}$ ($R^{31}$ each is independently a $C_{1-6}$ alkyl group such as a methyl group and an ethyl group, an alkylene group, a phenyl group, and a phenylene group). Examples of the organic group including an ester bond may include an organic group including an ester bond such as a methyl ester, an ethyl ester, and a phenyl ester.

Examples of the halogen atom may include a fluorine atom, a chlorine atom, a bromine atom, and an iodine atom.

Examples of the sulfonic acid compound as an anion site of the crosslinking catalyst of Formula (1) may include p-phenolsulfonic acid, o-cresol-4-sulfonic acid, p-cresol-2-sulfonic acid, 2-chloro-p-phenolsulfonic acid, 2-cyano-p-phenolsulfonic acid, 5-sulfosalicylic acid, 1,2-dihydroxybenzene-4-sulfonic acid, 1,2-dihydroxybenzene-4,5-disulfonic acid, 2-methoxy-p-phenolsulfonic acid, 2-methoxycarbonyl-p-phenolsulfonic acid, 1-methoxybenzene-4-sulfonic acid, 1-naphthol-4-sulfonic acid, 1-naphthol-5-sulfonic acid, 2-naphthol-6-sulfonic acid, 2-naphthol-7-sulfonic acid, 2,3-dihydroxynaphthalene-6-sulfonic acid, 2-hydroxynaphthalene-3,6-disulfonic acid, 2,7-dihydroxynaphthalene-3,6-disulfonic acid, and 2-hydroxyanthracene-7-sulfonic acid. Preferably, p-phenolsulfonic acid, o-cresol-4-sulfonic acid, and 5-sulfosalicylic acid are used.

The cation site $X^+$ of the crosslinking catalyst of Formula (1) include $NH_4^+$, a primary ammonium ion, a secondary ammonium ion, a tertiary ammonium ion, a quaternary ammonium ion, a sulfonium ion, and an iodonium cation. A primary ammonium ion, a secondary ammonium ion, a tertiary ammonium ion, and a quaternary ammonium ion are preferable and a secondary ammonium ion and a tertiary ammonium ion are particularly preferable.

Examples of the primary ammonium ion may include primary ammonium ions derived from methylamine, ethylamine, n-propylamine, n-butylamine, aniline, dimethylaniline, and the like.

Examples of the secondary ammonium ion may include secondary ammonium ions derived from dimethylamine, diethylamine, di-n-propylamine, diisopropylamine, di-n-butyl amine, pyrrolidine, piperidine, morpholine, 3,5-dimethylmorpholine, 2,6-dimethylpiperidine, methylaminoethanol, and the like.

Examples of the tertiary ammonium ion may include tertiary ammonium ions derived from trimethylamine, triethylamine, tri-n-propylamine, diisopropylethylamine, tri-n-butylamine, 1-methylpynolidine, 1-methylpiperidine, 1-ethylpiperidine, 4-methylmorpholine, 4-methylmorpholine, dimethylaminoethanol, diethylaminoethanol, methyldiethanolamine, ethyl diethanolamine, pyridine, 4-methylpyridine, 2,6-dimethylpyridine, 2,4,6-trimethyl pyridine, quinoline, and the like.

Examples of the quaternary ammonium ion may include quaternary ammonium ions such as tetramethylammonium, tetraethylammonium, tetra-n-propylammonium, tetra-n-butylammonium, benzyltetramethylammonium, and benzyltetraethylammonium.

Examples of the sulfonium ion may include sulfonium ions such as trimethylsulfonium, triethylsulfonium, phenyldimethylsulfonium, diphenylmethylsulfonium, and triphenylsulfonium.

Examples of the iodonium cation may include iodonium cations such as diphenyliodonium and bis(4-tert-butylphenyl)iodonium.

Cations derived from pyridine, 4-methylpyridine, tri-n-propylamine, morpholine, and 4-methylmorpholine are preferably included.

Examples of the crosslinking catalyst of Formula (1) may include crosslinking catalysts of Formulae (2-1) to (2-27).

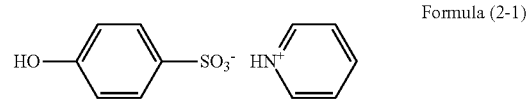

Formula (2-1)

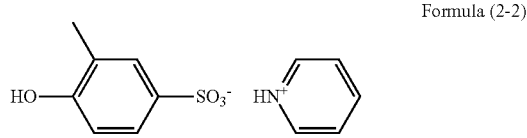

Formula (2-2)

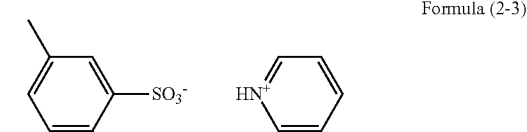

Formula (2-3)

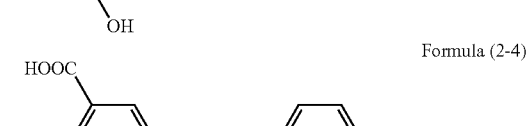

Formula (2-4)

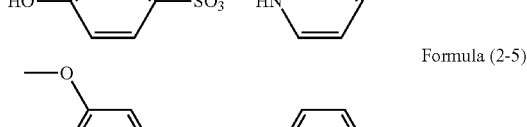

Formula (2-5)

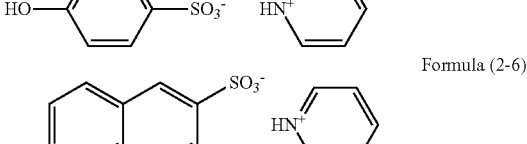

Formula (2-6)

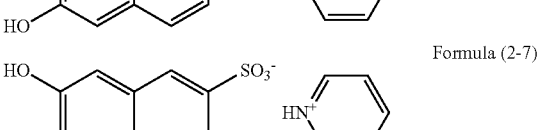

Formula (2-7)

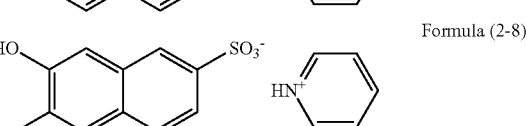

Formula (2-8)

Formula (2-9)
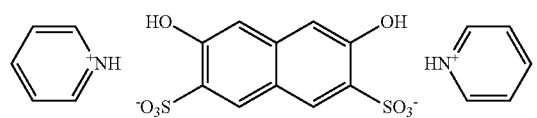

Formula (2-10)
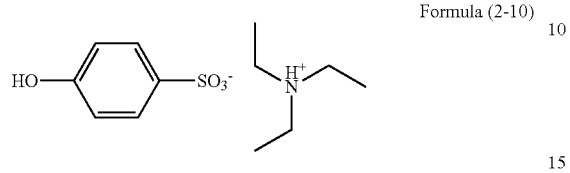

Formula (2-11)
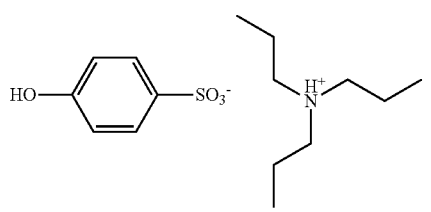

Formula (2-12)
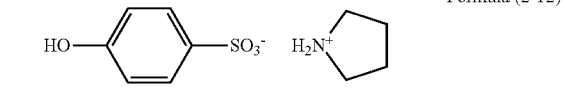

Formula (2-13)
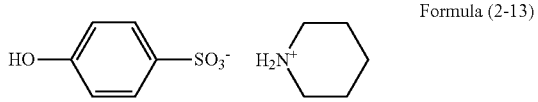

Formula (2-14)
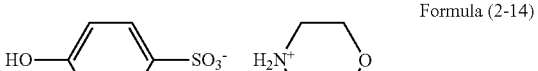

Formula (2-15)
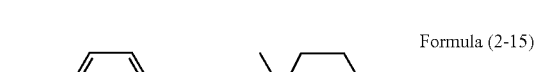

Formula (2-16)
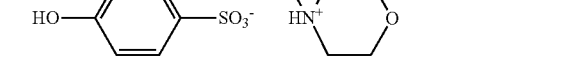

Formula (2-17)
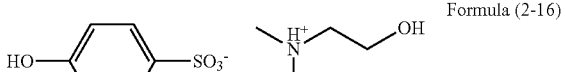

Formula (2-18)
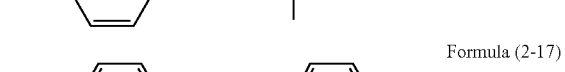

Formula (2-19)
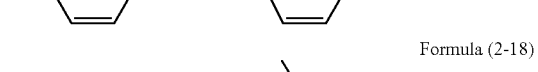

Formula (2-20)
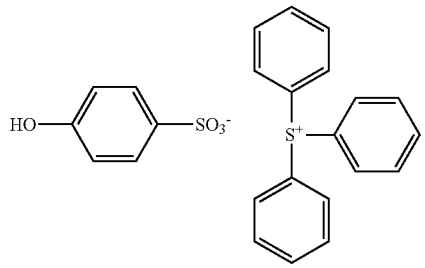

Formula (2-21)
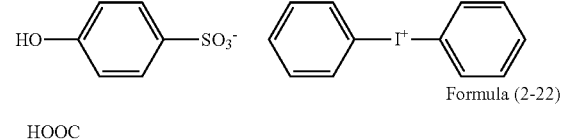

Formula (2-22)
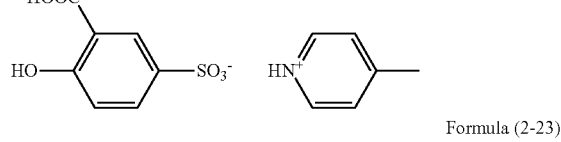

Formula (2-23)
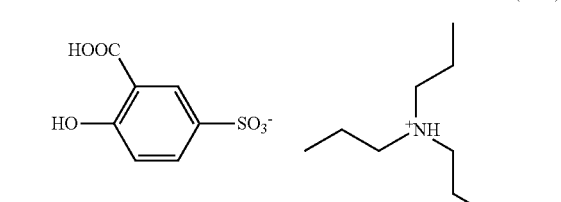

Formula (2-24)
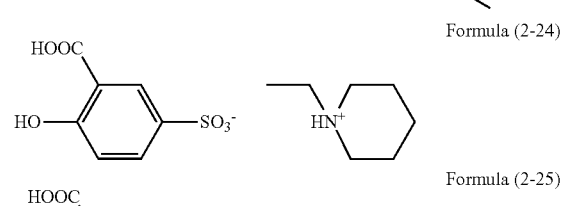

Formula (2-25)
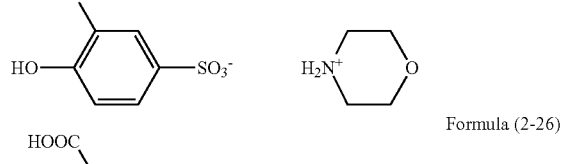

Formula (2-26)

Formula (2-27)
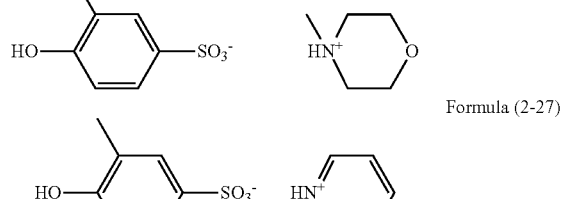

In the present invention, the following compounds other than the crosslinking catalyst of Formula (1) can be added in combination as a catalyst for promoting the crosslinking reaction. The compounds are acidic compounds such as p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, naphthalene carboxylic acid; and/or thermal acid generator such as 2,4,4,6-tetrabromocyclohexadienone, benzoin tosylate, 2-nitrobenzyl tosylate, and other organic sulfonic acid alkyl esters; or onium salt photoacid generators such as bis(4-t-butylphenyl)iodonium trifluoromethanesulfonate and triphenylsulfonium trifluoromethanesulfonate; halogen-containing photoacid generators such as phenyl-bis(trichloromethyl)-s-triazine; and sulfonic acid photoacid generators such as benzoin tosylate and N-hydroxysuccinimide trifluoromethanesulfonate. The amount of the crosslinking catalyst is 0.0001% by mass to 20% by mass, preferably 0.0005% by mass to 10% by mass, and further preferably 0.01% by mass to 3% by mass relative to the whole solid content.

Examples of the polymer resin contained in the resist underlayer film-forming composition of the present invention may include any one of a novolac resin, a polyester resin, a polyimide resin, an acrylic resin, and combination of them.

The resist underlayer film-forming composition of the present invention can include a crosslinking agent component. Examples of the crosslinking agent may include a melamine-based agent, a substituted urea-based agent, or an agent based on polymer thereof. Preferably, the crosslinking agent has at least two crosslink-forming substituents. Examples of the crosslinking agent may include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea. A condensate of these compounds can also be used.

As the crosslinking agent, a crosslinking agent having high heat resistance can be used. As the crosslinking agent having high heat resistance, a compound containing crosslink-forming substituents having aromatic rings (for example, benzene rings or naphthalene rings) in its molecule can preferably be used.

Examples of the compound may include a compound having a partial structure of Formula (3) and a polymer or oligomer having a repeating unit of Formula (4).

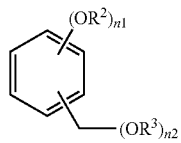

Formula (3)

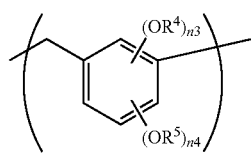

Formula (4)

In Formula (3) and Formula (4), $R^2$, $R^3$, $R^4$, and $R^5$ are hydrogen atoms or $C_{1-10}$ alkyl groups and the alkyl groups exemplified above can be used as these $C_{1-10}$ alkyl groups. In Formula (3) and Formula (4), n1 is an integer of 1 to 5; n2 is an integer of 1 to 5; (n1+n2) is an integer of 2 to 6; n3 is an integer of 1 to 3; n4 is an integer of 1 to 3; and (n3+n4) is an integer of 2 to 4.

The compound, the polymer, and the oligomer of Formula (3) and Formula (4) are exemplified as follows.

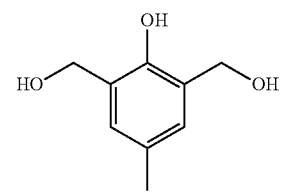

Formula (5-1)

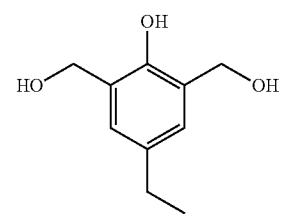

Formula (5-2)

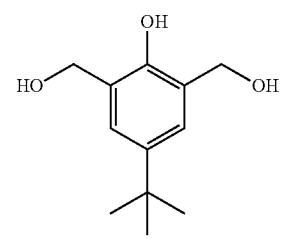

Formula (5-3)

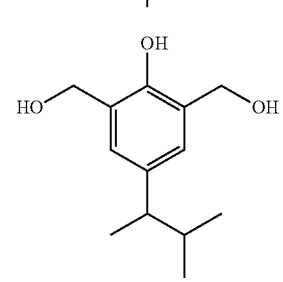

Formula (5-4)

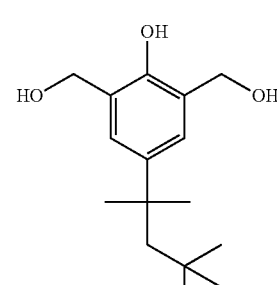

Formula (5-5)

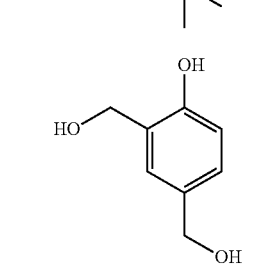

Formula (5-6)

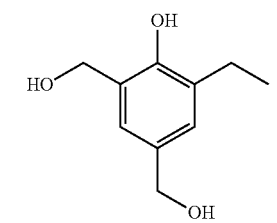

Formula (5-7)

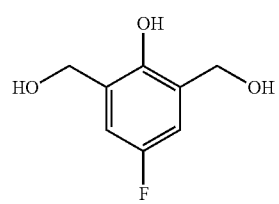
Formula (5-8)
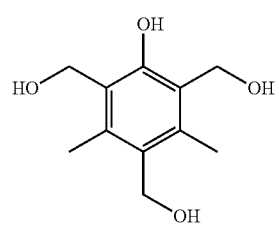
Formula (5-9)
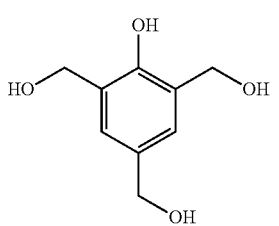
Formula (5-10)
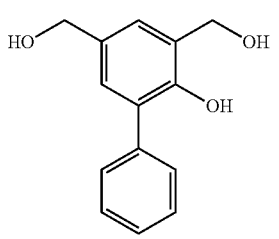
Formula (5-11)
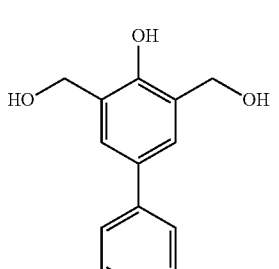
Formula (5-12)
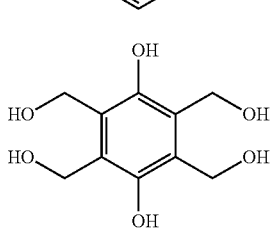
Formula (5-13)
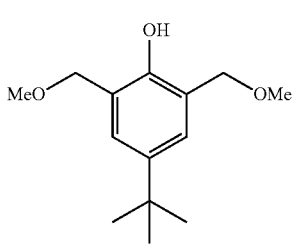
Formula (5-14)
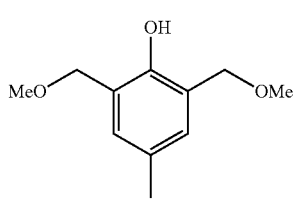
Formula (5-15)
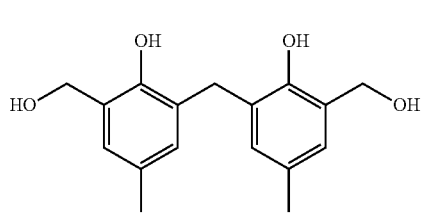
Formula (5-16)
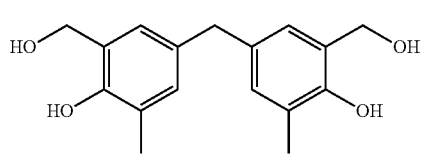
Formula (5-17)
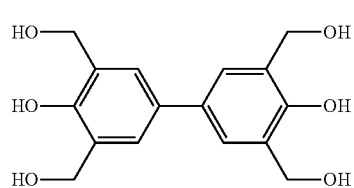
Formula (5-18)
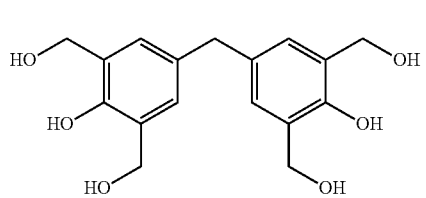
Formula (5-19)
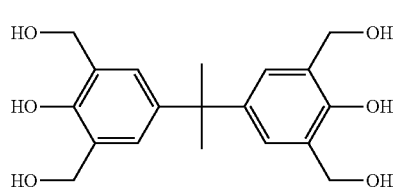
Formula (5-20)
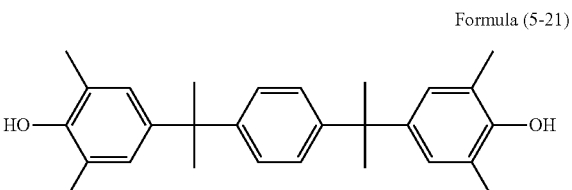
Formula (5-21)
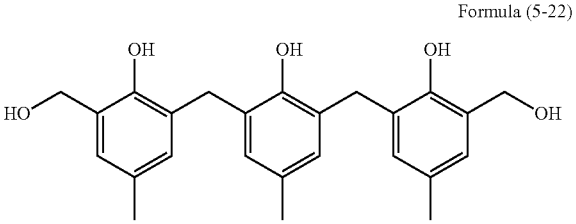
Formula (5-22)

-continued

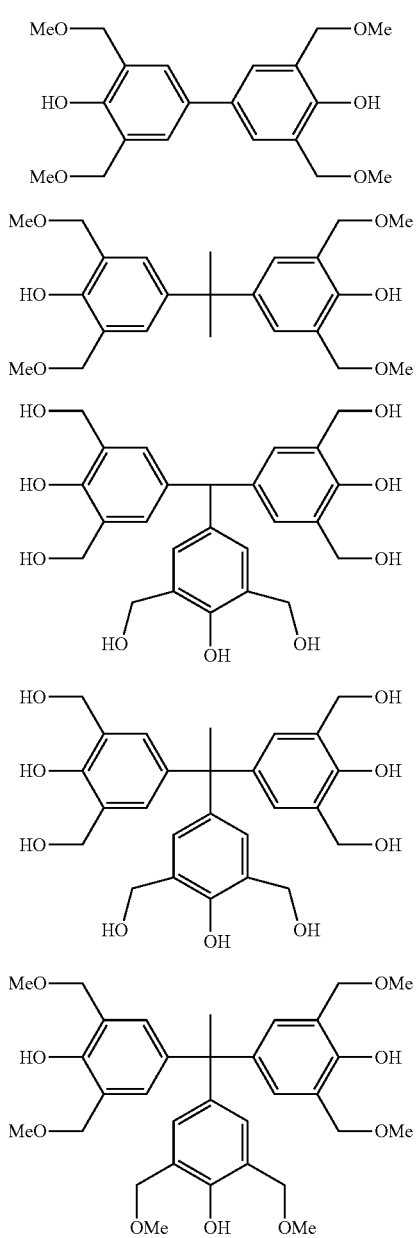

Formula (5-23)

Formula (5-24)

Formula (5-25)

Formula (5-26)

Formula (5-27)

The compounds can be obtained as commercial products manufactured by Asahi Organic Chemicals Industry Co., Ltd. and HONSHU CHEMICAL INDUSTRY CO., LTD. For example, among the crosslinking agent, the compound of Formula (5-24) can be obtained as TM-BIP-A (trade name, manufactured by Asahi Organic Chemicals Industry Co., Ltd.).

An amount of the crosslinking agent to be added varies depending on an application solvent used, a base substrate used, a required solution viscosity, a required film shape, and the like. The amount is 0.001% by mass to 80% by mass, preferably 0.01% by mass to 50% by mass, and further preferably 0.05% by mass to 40% by mass relative to the whole solid content. These crosslinking agents may cause a crosslinking reaction by self-condensation. The crosslinking agents, however, can cause a crosslinking reaction with a crosslinkable substituent when the crosslinkable substituent exists in the polymer of the present invention.

To the resist underlayer film material for lithography of the present invention, for example, a light absorbent, a rheology modifier, an adhesion assistance agent, and a surfactant can be added in addition to the components described above if necessary.

As further light absorbents, for example, commercially available light absorbents described in "Kogyoyo Shikiso no Gijutu to Shijyo (Technology and Market of Industrial Colorant)" (CMC Publishing Co., Ltd) and "Senryo Binran (Dye Handbook)" (The Society of Synthetic Organic Chemistry, Japan) can be preferably used. Preferably useable examples of the commercially available light absorbents include C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2. The light absorbents are usually added in ratio of 10% by mass or less, and preferably in a ratio of 5% by mass or less relative to the whole solid content of the resist underlayer film material for lithography.

The rheology modifier is added for the purpose of mainly improving flowability of the resist underlayer film-forming composition, and, particularly in a baking process, improving film thickness uniformity of the resist underlayer film and enhancing filling ability of the resist underlayer film-forming composition into inside of a hole. Specific examples of the rheology modifier may include phthalic acid derivatives such as dimethyl phthalate, diethyl phthalate, diisobutyl phthalate, dihexyl phthalate, and butylisodecyl phthalate, adipic acid derivatives such as di-normal-butyl adipate, diisobutyl adipate, diisooctyl adipate, and octyldecyl adipate, maleic acid derivatives such as di-normal-butylmaleate, diethyl maleate, and dinonyl maleate, oleic acid derivatives such as methyl oleate, butyl oleate, and tetrahydrofurfuryl oleate, or stearic acid derivatives such as normal-butyl stearate, and glyceryl stearate. These rheology modifiers are usually added in a ratio of less than 30% by mass relative to the whole solid content of the resist underlayer film material for lithography.

The adhesion assistance agent is mainly added for improving adhesion between the substrate or the resist and the resist underlayer film-forming composition and preventing the resist from peeling, particularly in development. Specific examples of the adhesion assistance agent may include chlorosilanes such as trimethylchlorosilane, dimethylvinylchlorosilane, methyldiphenylchlorosilane, and chloromethyldimethylchlorosilane, alkoxysilanes such as trimethylmethoxysilane, dimethyldiethoxysilane, methyldimethoxysilane, dimethylvinylethoxysilane, diphenyldimethoxysilane, and phenyltriethoxysilane, silazanes such as hexamethyldisilazane, N,N'-bis(trimethylsilyl)urea, dimethyltrimethylsilylamine, and trimethylsilylimidazole, silanes such as vinyltrichlorosilane, γ-chloropropyltrimethoxysilane, γ-aminopropyltriethoxysilane, and γ-glycidoxypropyltrimethoxysilane, heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine, and urea compounds or thiourea compounds such as 1,1-dimethylurea and 1,3-dimethylurea. These adhesion assistance agents are usually added in a ratio less than 5% by mass, and preferably in a ratio less than 2% by mass relative to the whole solid content of the resist underlayer film material for lithography.

To the resist underlayer film material for lithography of the present invention, a surfactant can be added for preventing generation of pinholes and striations and further improving applicability to surface unevenness. Examples of the surfactant may include nonionic surfactant such as polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303, and EF352 (manufactured by Tochem Products, trade name), MEGAFAC F171, F173, and R-30 (manufactured by Dainippon Ink and Chemicals Inc., trade name), Fluorad FC430 and FC431 (manufactured by Sumitomo 3M Ltd., trade name), Asahi guard AG710, Surflon S-382, SC101, SC102, SC103, SC104, SC105, and SC106 (manufactured by Asahi Glass Co., Ltd., trade name); and Organosiloxane Polymer KP341 (manufactured by Shin-Etsu Chemical Co., Ltd.). The amount of the surfactant to be added is usually 2.0% by mass or less and preferably 1.0% by mass or less relative to the whole solid content of the resist underlayer film material for lithography of the present invention. These surfactants can be added singly or in combination of two or more of them.

In the present invention, usable examples of a solvent dissolving the polymer, the crosslinking agent component, and the crosslinking catalyst may include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These solvents can be used singly or in combination of two or more of them.

In addition, these solvents can be used by mixing with a high boiling point solvent such as propylene glycol monobutyl ether and propylene glycol monobutyl ether acetate. Among these solvents, propylene glycol monomethyl ether, propylene glycol monomethyl ether acetate, ethyl lactate, butyl lactate, and cyclohexanone are preferable for improving a leveling property.

The resist used in the present invention is a photoresist and an electron beam resist.

As the photoresist applied on the resist underlayer film for lithography of the present invention, both negative photoresist and positive photoresist can be used. Examples of the photoresist include a positive photoresist made of a novolac resin and 1,2-naphthoquinonediazidesulfonate, a chemically amplified photoresist made of a binder having a group that increases an alkali dissolution rate by decomposing with an acid and a photoacid generator, a chemically amplified photoresist made of an alkali-soluble binder, a low molecular weight compound that increases an alkali dissolution rate of the photoresist by decomposing with an acid, and a photoacid generator, a chemically amplified photoresist made of a binder having a group that increases an alkali dissolution rate by decomposing with an acid, a low molecular weight compound that increases an alkali dissolution rate of the photoresist by decomposing with an acid, and a photoacid generator, and a photoresist having Si atoms in the framework of the molecule. Specific examples may include APEX-E (trade name, manufactured by Rohm and Haas Inc.)

Examples of the electron beam resist applied onto the resist underlayer film for lithography of the present invention may include a composition made of a resin containing Si—Si bonds in the main chain and containing aromatic rings at its ends and an acid generator generating an acid by irradiation with electron beams and a composition made of poly(p-hydroxystyrene) in which hydroxy groups are substituted with organic groups containing N-carboxyamine and an acid generator generating an acid by irradiation with electron beams. In the latter electron beam resist composition, the acid generated from the acid generator by the electron beam irradiation is reacted with the N-carboxyaminoxy groups of the polymer side chain and the polymer side chain is decomposed into a hydroxy group to exhibit alkali solubility. Consequently, the resist composition is dissolved into an alkali development liquid to form a resist pattern. Examples of the acid generator generating the acid by electron beam irradiation may include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl) pyridine, onium salts such as triphenylsulfonium salts and diphenyliodonium salts, and sulfonates such as nitrobenzyltosylate and dinitrobenzyltosylate.

As the development liquid for the resist having the resist underlayer film formed by using the resist underlayer film material for lithography of the present invention, the following aqueous alkali solutions can be used. The aqueous alkali solutions includes solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcoholamines such as dimethylethanolamine and triethanolamine; quaternary ammonium salt such as tetramethylammonium hydroxide, tetraethylammonium hydroxide, and choline; and cyclic amines such as pyrrole and piperidine. To the aqueous solutions of the alkalis described above, an adequate amount of alcohols such as isopropyl alcohol or a surfactant such as a nonionic surfactant can be added and the mixture can be used. Among these development liquids, aqueous solutions of the quaternary ammonium salts are preferable and aqueous solutions of tetraethylammonium hydroxide and choline are further preferable.

In the present invention, an organic solvent can be used as the development liquid. The development is carried out with the development liquid (solvent) after exposure. This allows an unexposed part of the photoresist to be removed to form a pattern of the photoresist when, for example, a positive photoresist is used.

Examples of the development liquid may include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, di ethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxy propionate, ethyl 3-methoxy propionate, ethyl 3-ethoxy propionate, and propyl 3-methoxy propionate. In addition, a surfactant and the like can be added to these development liquids. The development conditions are appropriately selected from a temperature of 5° C. to 50° C. and a time of 10 seconds to 600 seconds.

Subsequently, a method for forming the resist pattern of the present invention will be described. The resist underlayer film-forming composition is applied onto a substrate (for example, silicon/silicon dioxide coating, a glass substrate and a transparent substrate such as an ITO substrate) used for producing precision integrated circuit elements by appropriate application method such as a spinner and a coater and thereafter the coated composition is cured by baking to form an application type underlayer film. A film thickness of the resist underlayer film is preferably 0.01 µm to 3.0 Conditions for baking after the application are 80° C. to 350° C. for 0.5 minute to 120 minutes. Thereafter, a resist is directly applied onto the resist underlayer film or applied after forming a film made of one layer or several layers of a coating material on the application type underlayer film if necessary. Thereafter, the resist is irradiated with light or electron beams through the predetermined mask and is developed, rinsed, and dried to obtain an excellent resist pattern. Post Exposure Bake (PEB) of light and electron beams can also be carried out if necessary. The part of the resist underlayer film where the resist is removed through development by the previous process is removed by dry etching to form a desired pattern on the substrate.

The exposure light of the photoresist is actinic rays such as near ultraviolet rays, far ultraviolet rays, or extreme ultraviolet rays (for example, EUV, wavelength 13.5 nm) and, for example, light having a wavelength of 248 nm (KrF laser light), 193 nm (ArF laser light), or 157 nm (F2 laser light) is used. The light irradiation can be used without limitation as long as the acid is generated from the photoacid generator. An exposure amount is 1 mJ/cm$^2$ to 2000 mJ/cm$^2$, or 10 mJ/cm$^2$ to 1500 mJ/cm$^2$, or 50 mJ/cm$^2$ to 1000 mJ/cm$^2$.

The electron beam irradiation to the electron beam resist can be carried out by, for example, using an electron beam irradiation device.

In the present invention, a semiconductor device can be produced through a method comprising the steps of forming a resist underlayer film by using the resist underlayer film-forming composition onto a semiconductor substrate; forming a resist film on the resist underlayer film; forming a resist pattern by irradiation with light or electron beams and development; etching the resist underlayer film by using the resist pattern; and processing the semiconductor substrate by using the patterned resist underlayer film.

EXAMPLE

Synthesis Example 1

After 9.04 g of propylene glycol monomethyl ether was added to 2.26 g of p-phenolsulfonic acid (manufactured by Tokyo Chemical Industry Co., Ltd.) and p-phenolsulfonic acid was dissolved, 1.03 g of pyridine was added under cooling with ice. The mixture was added to 50.00 g of 2-butanone and the resultant mixture was left to stand at room temperature. The precipitated crystal was filtered and dried under reduced pressure to obtain a crosslinking catalyst of Formula (2-1) as a white crystal (2.12 g). The composition ratio of p-phenolsulfonic acid and pyridine calculated from the integral ratio of $^1$H-NMR was 1:0.95.

Synthesis Example 2

After 8.28 g of propylene glycol monomethyl ether was added to 2.07 g of p-phenolsulfonic acid (manufactured by Tokyo Chemical Industry Co., Ltd.) and p-phenolsulfonic acid was dissolved, 1.10 g of 4-methylpyridine was added under cooling with ice. The mixture was added to 50.00 g of ethyl acetate and the resultant mixture was left to stand at room temperature. The precipitate was filtered and dried under reduced pressure to obtain a crosslinking catalyst of Formula (2-17) as a pale orange crystal (2.32 g). The composition ratio of p-phenolsulfonic acid and 4-methylpyridine calculated from the integral ratio of $^1$H-NMR was 1:0.98.

Synthesis Example 3

After 8.16 g of propylene glycol monomethyl ether was added to 2.04 g of 5-sulfosalicylic acid (manufactured by Tokyo Chemical Industry Co., Ltd.) and 5-sulfosalicylic acid was dissolved, 0.87 g of 4-methylpyridine was added under cooling with ice. The mixture was added to 50.00 g of 2-butanone and the resultant mixture was left to stand at room temperature. The precipitate was filtered and dried under reduced pressure to obtain a crosslinking catalyst of Formula (2-22) as a white crystal (2.13 g). The composition ratio of 5-sulfosalicylic acid and 4-methylpyridine calculated from the integral ratio of $^1$H-NMR was 1:0.99.

Synthesis Example 4

After 20.00 g of 2-butanone was added to 2.03 g of 5-sulfosalicylic acid (manufactured by Tokyo Chemical Industry Co., Ltd.) and 5-sulfosalicylic acid was dissolved, 1.33 g of tri-n-propylamine was added under cooling with ice. The resultant mixture was left to stand at room temperature. The precipitate was filtered and dried under reduced pressure to obtain a crosslinking catalyst of Formula (2-23) as a white powder (2.00 g). The composition ratio of 5-sulfosalicylic acid and tri-n-propylamine calculated from the integral ratio of $^1$H-NMR was 1:0.99.

Synthesis Example 5

After 20.00 g of 2-butanone was added to 2.06 g of 5-sulfosalicylic acid (manufactured by Tokyo Chemical Industry Co., Ltd.) and 5-sulfosalicylic acid was dissolved, 1.07 g of 1-ethylpiperidine was added under cooling with ice. The resultant mixture was left to stand at room temperature. The precipitate was filtered and dried under reduced pressure to obtain a crosslinking catalyst of Formula (2-24) as a white powder (1.99 g). The composition ratio of 5-sulfosalicylic acid and 1-ethylpiperidine calculated from the integral ratio of $^1$H-NMR was 1:0.99.

Synthesis Example 6

After 20.00 g of 2-butanone was added to 2.01 g of 5-sulfosalicylic acid (manufactured by Tokyo Chemical Industry Co., Ltd.) and 5-sulfosalicylic acid was dissolved, 0.80 g of morpholine was added under cooling with ice. The resultant mixture was left to stand at room temperature. The precipitate was filtered and dried under reduced pressure to obtain a crosslinking catalyst of Formula (2-25) as a pale yellow powder (2.25 g). The composition ratio of 5-sulfosalicylic acid and morpholine calculated from the integral ratio of $^1$H-NMR was 1:1.22.

Synthesis Example 7

After 20.00 g of 2-butanone was added to 2.03 g of 5-sulfosalicylic acid (manufactured by Tokyo Chemical Industry Co., Ltd.) and 5-sulfosalicylic acid was dissolved, 0.94 g of 4-methylmorpholine and a small amount of methanol were added under cooling with ice. The resultant mixture was left to stand at room temperature. The precipitate was filtered and dried under reduced pressure to obtain a crosslinking catalyst of Formula (2-26) as a pale yellow powder (1.72 g). The composition ratio of 5-sulfosalicylic acid and 4-methylmorpholine calculated from the integral ratio of $^1$H-NMR was 1:1.00.

Synthesis Example 8

8.83 g of pyridine was added to 20.00 g of o-cresol-4-sulfonic acid solution (manufactured by KANTO CHEMICAL CO., INC.) under cooling with ice. The mixture was added to 130.00 g of 2-butanone and the resultant mixture was left to stand at room temperature. The precipitate was filtered and dried under reduced pressure to obtain a crosslinking catalyst of Formula (2-27) as a white crystal (16.24 g). The composition ratio of o-cresol-4-sulfonic acid and pyridine calculated from the integral ratio of $^1$H-NMR was 1:1.05.

Example 1

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 1 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

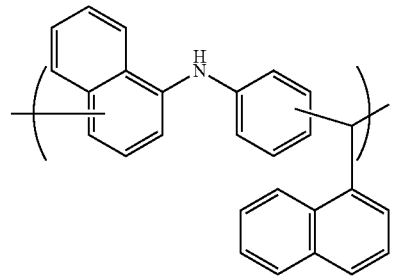

Formula (6-1)

Example 2

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 2 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

Example 3

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 3 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

Example 4

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 4 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

Example 5

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 5 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

Example 6

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 6 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

Example 7

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 7 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

Example 8

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 8 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

Example 9

1.25 g of a novolac resin of Formula (6-1) for the resist underlayer film-forming composition and 0.04 g of the crosslinking catalyst obtained in Synthesis Example 1 were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography. The resist underlayer film-forming composition of the present example does not contain a crosslinking agent.

Example 10

1.02 g of a novolac resin of Formula (6-2) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of the crosslinking catalyst obtained in Synthesis Example 1 were dissolved into 2.38 g of propylene glycol monomethyl ether, 7.13 g of propylene glycol monomethyl ether acetate, and 14.25 g of cyclohexanone to prepare a solution of the resist underlayer film-forming composition for lithography.

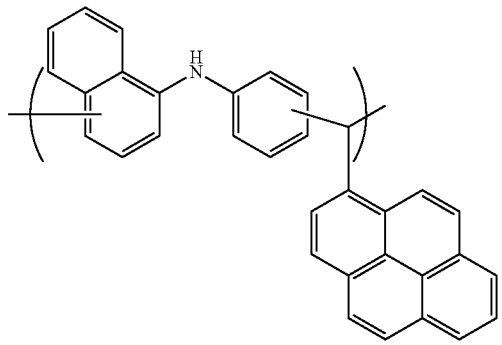

Formula (6-2)

Example 11

0.98 g of a polyimide resin of Formula (6-3) for the resist underlayer film-forming composition, 0.25 g of tetramethoxymethylglycoluril (trade name: POWDERLINK (registered trademark) 1174, manufactured by Nihon Cytec Industries Inc.) as a crosslinking agent, and 0.02 g of the crosslinking catalyst obtained in Synthesis Example 1 were dissolved into 16.63 g of propylene glycol monomethyl ether, and 7.13 g of propylene glycol monomethyl ether acetate to prepare a solution of the resist underlayer film-forming composition for lithography.

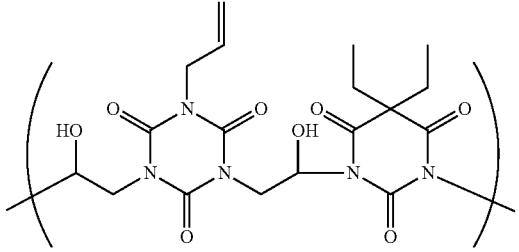

Formula (6-3)

Example 12

0.98 g of a polyester resin of Formula (6-4) for the resist underlayer film-forming composition, 0.25 g of tetramethoxymethylglycoluril (trade name: POWDERLINK (registered trademark) 1174, manufactured by Nihon Cytec Industries Inc.) as a crosslinking agent, and 0.02 g of the crosslinking catalyst obtained in Synthesis Example 1 were dissolved into 16.63 g of propylene glycol monomethyl ether, and 7.13 g of propylene glycol monoethyl ether to prepare a solution of the resist underlayer film-forming composition for lithography.

Formula (6-4)

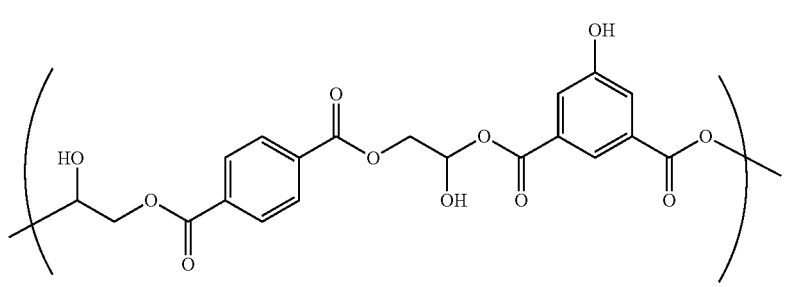

Example 13

0.98 g of an acrylic resin of Formula (6-5) for the resist underlayer film-forming composition, 0.25 g of tetramethoxymethylglycoluril (trade name: POWDERLINK (registered trademark) 1174, manufactured by Nihon Cytec Industries Inc.) as a crosslinking agent, and 0.02 g of the crosslinking catalyst obtained in Synthesis Example 1 were dissolved into 21.38 g of propylene glycol monomethyl ether, and 2.38 g of propylene glycol monomethyl ether acetate to prepare a solution of the resist underlayer film-forming composition for lithography.

Formula (6-5)

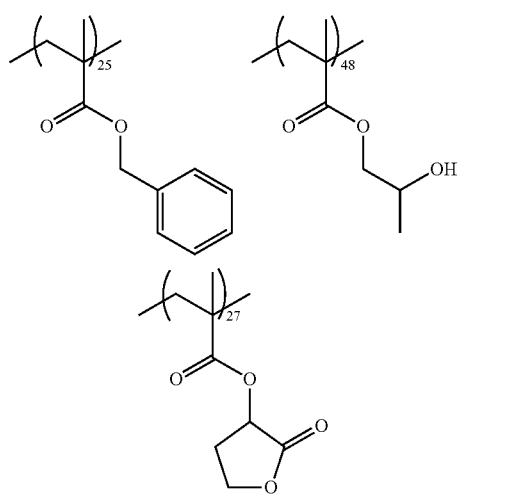

Comparative Example 1

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of pyridinium p-toluenesulfonate of Formula (7-1) (manufactured by Tokyo Chemical Industry Co., Ltd.) as a crosslinking catalyst were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

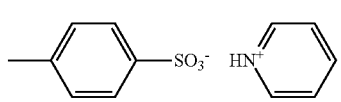

Formula (7-1)

Comparative Example 2

1.25 g of a novolac resin of Formula (6-1) for the resist underlayer film-forming composition and 0.04 g of pyridinium p-toluenesulfonate of Formula (7-1) (manufactured by Tokyo Chemical Industry Co., Ltd.) as a crosslinking catalyst were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography. The resist underlayer film-forming composition of the present example does not contain a crosslinking agent.

Comparative Example 3

1.02 g of a novolac resin of Formula (6-2) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of pyridinium p-toluenesulfonate of Formula (7-1) (manufactured by Tokyo Chemical Industry Co., Ltd.) as a crosslinking catalyst were dissolved into 2.38 g of propylene glycol monomethyl ether, 7.13 g of propylene glycol monomethyl ether acetate, and 14.25 g of cyclohexanone to prepare a solution of the resist underlayer film-forming composition for lithography.

Comparative Example 4

0.98 g of a polyimide resin of Formula (6-3) for the resist underlayer film-forming composition, 0.25 g of tetramethoxymethylglycoluril (trade name: POWDERLINK (registered trademark) 1174, manufactured by Nihon Cytec Industries Inc.) as a crosslinking agent, and 0.02 g of pyridinium p-toluenesulfonate of Formula (7-1) (manufactured by Tokyo Chemical Industry Co., Ltd.) as a crosslinking catalyst were dissolved into 16.63 g of propylene glycol monomethyl ether, and 7.13 g of propylene glycol monomethyl ether acetate to prepare a solution of the resist underlayer film-forming composition for lithography.

Comparative Example 5

0.98 g of a polyester resin of Formula (6-4) for the resist underlayer film-forming composition, 0.25 g of tetramethoxymethylglycoluril (trade name: POWDERLINK (registered trademark) 1174, manufactured by Nihon Cytec Industries Inc.) as a crosslinking agent, and 0.02 g of pyridinium p-toluenesulfonate of Formula (7-1) (manufactured by Tokyo Chemical Industry Co., Ltd.) as a crosslinking catalyst were dissolved into 16.63 g of propylene glycol monomethyl ether, and 7.13 g of propylene glycol monoethyl ether to prepare a solution of the resist underlayer film-forming composition for lithography.

Comparative Example 6

0.98 g of an acrylic resin of Formula (6-5) for the resist underlayer film-forming composition, 0.25 g of tetramethoxymethylglycoluril (trade name: POWDERLINK (registered trademark) 1174, manufactured by Nihon Cytec Industries Inc.) as a crosslinking agent, and 0.02 g of pyridinium p-toluenesulfonate of Formula (7-1) (manufactured by Tokyo Chemical Industry Co., Ltd.) as a crosslinking catalyst were dissolved into 21.38 g of propylene glycol monomethyl ether, and 2.38 g of propylene glycol monomethyl ether acetate to prepare a solution of the resist underlayer film-forming composition for lithography.

Comparative Example 7

1.02 g of a novolac resin of Formula (6-1) for the resist underlayer film-forming composition, 0.20 g of 3,3',5,5'-tetramethoxymethyl-4,4'-bisphenol (trade name: TMOM-BP, manufactured by Honshu Chemical Industry Co., Ltd.) as a crosslinking agent, and 0.03 g of p-phenolsulfonic acid hydrate of Formula (7-2) (manufactured by Tokyo Chemical Industry Co., Ltd.) as a crosslinking catalyst were dissolved into 4.75 g of propylene glycol monomethyl ether, 14.25 g of propylene glycol monomethyl ether acetate, and 4.75 g of cyclohexanone to prepare a solution of the resist underlayer film-forming composition for lithography.

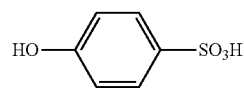

Formula (7-2)

(Measurement of Sublimate Amount)

A sublimate amount was measured with sublimate amount measurement apparatus described in WO 2007/111147 pamphlet. First, each of the resist underlayer film-forming compositions prepared in Examples 1 to 13 and Comparative Examples 1 to 6 was applied onto a silicon wafer substrate having a diameter of 4 inch with a spin coater so that the film thickness was 100 nm. The wafer onto which the resist underlayer film was applied was placed in the sublimate amount measurement apparatus integrally equipped with a hot plate and baked for 120 seconds to collect the sublimate into a Quartz Crystal Microbalance (QCM) sensor, that is, a quartz oscillator on which electrodes were formed. The QCM sensor can measure a slight mass change by using a property that attachment of the sublimate to the surface (electrodes) of the quartz oscillator changes (decreases) the frequency of the quartz oscillator depending on the mass of the attached sublimate.

Detailed measurement procedure is as follows. The temperature of the hot plate in the sublimate amount measurement apparatus was raised to the measuring temperature listed in Table 1 to Table 6. A pump flow rate was set to 1 m$^3$/s and the apparatus was left to stand for the first 60 seconds for stabilizing the apparatus. Immediately thereafter, the wafer coated with the resist underlayer film was quickly placed on the hot plate through a sliding opening. The sublimate generated from 60 seconds to 180 seconds after the placement (during 120 seconds) was collected. Flow attachment (detection part) connecting the QCM sensor of the sublimate amount measurement apparatus and a collection funnel was used without attaching a nozzle. Consequently, air flow inflowed without being narrowed from a channel (a bore diameter: 32 mm) of a chamber unit having a distance from the sensor (quartz oscillator) of 30 mm. A material containing silicon and aluminum as main components (AlSi) was used for the electrodes in the QCM sensor. The QCM sensor had a diameter of the quartz oscillator (sensor diameter) of 14 mm, an electrode diameter on the surface of the quartz oscillator of 5 mm, and a resonance frequency of 9 MHz.

The obtained frequency change was converted to gram based on the proper value of the quartz oscillator used for the measurement to clarify the relationship between the sublimate amount from one wafer onto which the resist underlayer film was applied and the time elapsed. Here, the initial 60 seconds was a period of time when the apparatus was left to stand for stabilizing the apparatus (the wafer was not placed). The measurement value measured at a point of time of 60 seconds to at a point of time of 180 seconds after placing the wafer on the hot plate is a measurement value of the sublimate amount from the wafer. The sublimate amounts of the resist underlayer films quantified with the apparatus are listed in Table 1 to Table 6 as sublimate amount ratios. The sublimate amount ratio is a normalized value in which the sublimate amount generated from the resist underlayer films of Comparative Example 1 to Comparative Example 6 are determined as 1.

TABLE 1

Sublimate amount generated from resist underlayer film

| Resist underlayer film | Baking temperature | Sublimate amount ratio |
|---|---|---|
| Example 1 | 240° C. | 0.52 |
| Example 2 | 240° C. | 0.57 |
| Example 3 | 240° C. | 0.94 |
| Example 4 | 240° C. | 0.94 |
| Example 5 | 240° C. | 0.85 |
| Example 6 | 240° C. | 0.30 |
| Example 7 | 240° C. | 0.30 |
| Example 8 | 240° C. | 0.56 |
| Comparative Example 1 | 240° C. | 1.00 |

TABLE 2

Sublimate amount generated from resist underlayer film

| Resist underlayer film | Baking temperature | Sublimate amount ratio |
|---|---|---|
| Example 9 | 300° C. | 0.81 |
| Comparative Example 2 | 300° C. | 1.00 |

TABLE 3

Sublimate amount generated from resist underlayer film

| Resist underlayer film | Baking temperature | Sublimate amount ratio |
|---|---|---|
| Example 10 | 240° C. | 0.92 |
| Comparative Example 3 | 240° C. | 1.00 |

TABLE 4

Sublimate amount generated from resist underlayer film

| Resist underlayer film | Baking temperature | Sublimate amount ratio |
|---|---|---|
| Example 11 | 205° C. | 0.17 |
| Comparative Example 4 | 205° C. | 1.00 |

TABLE 5

Sublimate amount generated from resist underlayer film

| Resist underlayer film | Baking temperature | Sublimate amount ratio |
|---|---|---|
| Example 12 | 205° C. | 0.16 |
| Comparative Example 5 | 205° C. | 1.00 |

TABLE 6

Sublimate amount generated from resist underlayer film

| Resist underlayer film | Baking temperature | Sublimate amount ratio |
|---|---|---|
| Example 13 | 205° C. | 0.14 |
| Comparative Example 6 | 205° C. | 1.00 |

As seen from Table 1, the sublimate amount ratio generated from the resist underlayer film-forming compositions of Example 1 to Example 8 were smaller than the sublimate amount ratio generated from the resist underlayer film-forming composition of Comparative Example 1. In other words, the crosslinking catalysts applied in Example 1 to Example 8 allowed the amounts of generated sublimates to be reduced effectively. As seen from Table 2, the sublimate amount ratio of Example 9 was smaller than that of the resist underlayer film-forming composition in Comparative Example 2. In other words, even in Example 9 in which the crosslinking agent is not contained, the crosslinking catalyst applied in Example 9 showed the effect of reduction in the sublimate amount. As seen from Table 3 to Table 6, resist underlayer film-forming compositions of Example 10 to Example 13 generated smaller sublimate amounts than those of the resist underlayer film-forming compositions in Comparative Example 3 to Comparative Example 6, respectively. In other words, the crosslinking catalysts applied in Example 10 to Example 13 were able to achieve an effective sublimate reduction effect, regardless of the types of the polymer resins in the resist underlayer film-forming compositions. Consequently, the aryl sulfonic acid salt having a hydroxy group according to the present invention allows the sublimate amount generated from the resist underlayer film to be reduced effectively, compared with an aryl sulfonic acid salt not having a hydroxy group.

(Evaluation of Aging Resistance)

Each of the resist underlayer film-forming compositions of Example 1 and Comparative Example 7 was applied onto a silicon wafer so that the film thickness was 100 nm. The sublimate amounts generated from the resist underlayer films at the time of baking at 240° C. for 60 seconds were measured with the sublimate amount measurement apparatus. The sublimate amounts generated at this time are listed as normalized values in which the sublimate amount generated from the resist underlayer film of Comparative Example 1 is determined as 1 ($S_A$). Subsequently, storage tests of the resist underlayer film-forming compositions were carried out under conditions of 35° C. for 2 weeks and sublimate amounts were measured again using the apparatus. The sublimate amounts generated at this time are listed as normalized values in which the sublimate amount generated from the resist underlayer film of Comparative Example 1 before the storage test is determined as 1 ($S_B$). The degrees of aging (deterioration) of the resist underlayer films were evaluated from the sublimate amount measurement by calculating increase/decrease rates ($S_B/S_A$) of the sublimate amount ratios before and after the storage test. In other words, as the increase/decrease rate ($S_B/S_A$) of the sublimate amount ratios before and after the storage test becomes larger, the sublimate amount from the resist underlayer film becomes larger and the aging by the storage test more easily occurs. The sublimate amounts before the storage test ($S_A$), the sublimate amounts after the storage test ($S_B$), and the increase/decrease rates ($S_B/S_A$) of the sublimate amounts are listed in Table 7.

TABLE 7

Sublimate amount generated from resist underlayer film

| Resist underlayer film | Sublimate amount before storage test ($S_A$) | Sublimate amount after storage test ($S_B$) | Increase/decrease rate of sublimate amount ($S_B/S_A$) |
|---|---|---|---|
| Example 1 | 0.52 | 0.88 | 1.69 |
| Comparative Example 7 | 0.44 | 1.18 | 2.66 |

As seen from Table 7, the resist underlayer film-forming composition of Example 1 generated larger sublimate amount measured before the storage test but generates smaller sublimate amount measured after the storage test than the resist underlayer film-forming composition of Comparative Example 7. In other word, the resist underlayer film-forming composition of Example 1 has smaller increase/decrease rate of the sublimate amounts before and after the storage test. Namely, the crosslinking acid catalyst applied in Example 1 is less likely to cause aging and allows the sublimate amount to be reduced for a long period of time. Consequently, the aryl sulfonic acid salt having a hydroxy group according to the present invention can reduce quality deterioration in aging, compared with the aryl sulfonic acid having a hydroxy group that is not in salt form.

INDUSTRIAL APPLICABILITY

Accordingly, by providing the resist underlayer film-forming composition of the present invention, it is possible to reduce the amount of the sublimation component (sublimate) derived from the resist underlayer film-forming composition, which is generated during the formation of the underlayer film by baking the resist underlayer film-forming composition, suppress the aging (deterioration) of the resist underlayer film-forming composition, and improve the storage stability of the quality.

The invention claimed is:

1. A resist underlayer film-forming composition comprising an aryl sulfonic acid salt compound having a hydroxy group of Formula (1):

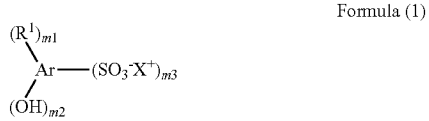

Formula (1)

(where Ar is a benzene ring or an aromatic hydrocarbon ring in which benzene rings are condensed; $R^1$ each is a substituent of a hydrogen atom in the aromatic ring and is a nitro group, an amino group, a carboxy group, a halogen atom, a $C_{1-10}$ alkoxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group combining thereof; m1 is an integer of 0 to (2+2n), m2 and m3 each is an integer of 1 to (3+2n), and (m1+m2+m3) is an integer of 2 to (4+2n), with the proviso that n is the number of the benzene rings or the number of the condensed benzene rings in the aromatic hydrocarbon ring and is an integer of 1 to 6; $X^+$ is $NH_4^+$, a primary ammonium ion, a secondary ammonium ion, a tertiary ammonium ion, a quaternary ammonium ion, a sulfonium ion, or an iodonium cation).

2. The resist underlayer film-forming composition according to claim 1, wherein Ar is a benzene ring.

3. The resist underlayer film-forming composition according to claim 1, wherein X+ is an ammonium ion.

4. The resist underlayer film-forming composition according to claim 1, wherein $R^1$ is a methyl group or a carboxy group.

5. The resist underlayer film-forming composition according to claim 1, wherein m1 is 0 and m2 and m3 each is 1.

6. The resist underlayer film-forming composition according to claim 1, further comprising a crosslinking agent.

7. A resist underlayer film obtained by applying the resist underlayer film-forming composition according to claim 1 onto a semiconductor substrate and baking the applied resist underlayer film-forming composition.

8. A method for forming a resist pattern used for semiconductor production, the method comprising a step of forming a resist underlayer film by applying the resist underlayer film-forming composition according to claim 1 onto a semiconductor substrate and baking the applied resist underlayer film-forming composition.

9. A method for producing a semiconductor device, the method comprising steps of:
    forming a resist underlayer film by using the resist underlayer film-forming composition according to claim 1 onto a semiconductor substrate;
    forming a resist film on the resist underlayer film;
    forming a resist pattern by irradiation with light or an electron beam and development;
    etching the resist underlayer film by using the formed resist pattern; and
    processing the semiconductor substrate by using the patterned resist underlayer film.

10. A method for producing a semiconductor device, the method comprising steps of:
    forming a resist underlayer film by using the resist underlayer film-forming composition according to claim 1, onto a semiconductor substrate;
    forming a hard mask on the resist underlayer film;
    forming a resist film on the hard mask;
    forming a resist pattern by irradiation with light or an electron beam and development;
    etching the hard mask by using the formed resist pattern;
    etching the resist underlayer film by using the patterned hard mask; and
    processing the semiconductor substrate by using the patterned resist underlayer film.

11. The method for producing a semiconductor device according to claim 10, wherein the hard mask is formed by application of an inorganic substance or vapor deposition of an inorganic substance.

* * * * *